(12) United States Patent
Jin

(10) Patent No.: US 10,270,398 B2
(45) Date of Patent: *Apr. 23, 2019

(54) LOW NOISE AMPLIFIER

(71) Applicant: Taiwan Semiconductor Manufacturing Company, Ltd., Hsinchu (TW)

(72) Inventor: Jun-De Jin, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/676,008

(22) Filed: Aug. 14, 2017

(65) Prior Publication Data

US 2017/0346449 A1 Nov. 30, 2017

Related U.S. Application Data

(63) Continuation of application No. 14/486,749, filed on Sep. 15, 2014, now Pat. No. 9,735,740.

(51) Int. Cl.
*H03F 1/26* (2006.01)
*H03F 1/56* (2006.01)
*H03F 1/34* (2006.01)
*H03F 3/193* (2006.01)

(52) U.S. Cl.
CPC .............. *H03F 1/26* (2013.01); *H03F 1/347* (2013.01); *H03F 1/565* (2013.01); *H03F 3/193* (2013.01); *H03F 2200/294* (2013.01); *H03F 2200/372* (2013.01)

(58) Field of Classification Search
USPC .................................. 330/302, 292, 76, 277
See application file for complete search history.

(56) References Cited

U.S. PATENT DOCUMENTS

| 7,199,652 B2 | 4/2007 | Morimoto et al. |
| 7,466,205 B1 | 12/2008 | Lin et al. |
| 8,610,506 B2 | 12/2013 | Mineyama |

OTHER PUBLICATIONS

Lee, Hanil et al., "A 3GHz Subthreshold CMOS Low Noise Amplifier," 2006 IEEE Radio Frequency Integrated Circuits (RFIC) Symposium, Jun. 10-13, 2006, 4 pages.
Perumana, Bevin George et al., "A Fully Monolithic 260-u W, 1-GHz Subthreshold Low Noise Amplifier," IEEE Microwave and Wireless Components Letters, vol. 15, No. 6, Jun. 2005, 3 pages.
Zhang, Fan et al., "A 1.6mW 300mV-Supply 2.4GHz Receiver with -94dBm Sensitivity for Energy-Harvesting Applications," ISSCC 2013/ Session 25/ Energy Efficient Wireless/25.9, 2013 IEEE International Solid-State Circuits conference, 3 pages.

*Primary Examiner* — Hieu P Nguyen
(74) *Attorney, Agent, or Firm* — Slater Matsil, LLP

(57) ABSTRACT

A low noise amplifier includes an amplifier transistor having a source, a gate, and a drain. An input node is coupled to the gate. An output node is coupled to the drain. An inductor is coupled between the gate and the drain.

20 Claims, 3 Drawing Sheets

LOW NOISE AMPLIFIER

PRIORITY CLAIM AND CROSS-REFERENCE

This application is a continuation of U.S. patent application Ser. No. 14/486,749, entitled "Low Noise Amplifier," filed on Sep. 15, 2014, which application is incorporated herein by reference.

BACKGROUND

A low noise amplifier is an electronic amplifier used to amplify possibly weak signals, for example, captured by using an antenna. The low noise amplifier is placed at the front-end of a radio receiver circuit in some applications. Noise figure and gain are among performance factors to consider for the low noise amplifier. The overall noise figure (NF) of the receiver's front-end is dominated by the first few stages.

The effect of noise from subsequent stages of the receiver chain is reduced by the gain of the low noise amplifier, while the noise of the low noise amplifier itself is injected directly into the received signal. Thus, it is necessary for the low noise amplifier to boost the desired signal power while adding as little noise and distortion as possible, so that the retrieval of the signal is possible in the later stages in the system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
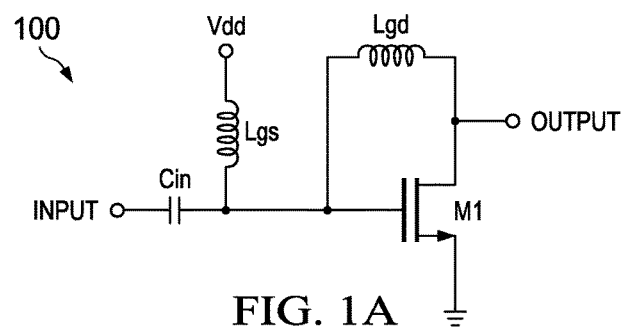
FIG. 1A is a schematic diagram of a low noise amplifier according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For low voltage and low power applications, a low noise amplifier with good performance that can operate within the specified low voltage and low power are needed. Such a low-noise amplifier is used in both wire line devices such as Universal Serial Bus (USB) devices and wireless devices such as Bluetooth or WiFi devices, among many other applications. Some low noise amplifiers designed for such applications suffer from poor noise figure, low gain, poor input impedance matching, low operating frequency, and/or complex design, and sometimes not fully integrated into a chip with off-chip components.

FIG. 1A is a schematic diagram of a low noise amplifier 100 according to some embodiments. The low noise amplifier 100 includes an amplifier transistor M1 that has a source, a gate, and a drain. In some embodiments, the amplifier transistor M1 is an n-channel metal-oxide-semiconductor field-effect (NMOS) transistor. An input node is coupled to the gate of the amplifier transistor M1. An output node is coupled to the drain the amplifier transistor M1. A first inductor Lgd is coupled between the gate and the drain of the amplifier transistor M1. A second inductor Lgs is coupled between the gate of the amplifier transistor M1 and a high voltage supply node (e.g. Vdd). The source of the amplifier transistor M1 is coupled to a low voltage power supply node (e.g., ground or Vss). The amplifier transistor M1 is operated in sub-threshold region with Vgs=Vds.

The amplifier transistor M1 has three parasitic capacitances: a parasitic capacitance Cgd between the gate and the drain of the amplifier transistor M1, a parasitic capacitance Cds between the drain and the source of the amplifier transistor M1, and a parasitic capacitance Cgs between the gate and the source of the amplifier transistor M1.

The first inductor Lgd is arranged to compensate the parasitic capacitance Cgd between the gate and the drain of the amplifier transistor M1. In some embodiments, the first inductor Lgd has a value based on a resonance condition of the parasitic capacitance Cgd and the first inductor Lgd. In some embodiments, the operating frequency f0 of the low noise amplifier 100 is close to a resonance frequency f0 of the resonance condition for the LC circuit. In some embodiments, the value of the first inductor Lgd is equal to or greater than L, where L is obtained from the following equation for the resonance condition of the LC circuit.

$$f0 = \frac{1}{2\pi\sqrt{L \cdot Cgd}}, \quad \text{Equation (1)}$$

or $$L = \frac{1}{(2\pi f0)^2 \cdot Cgd}, \quad \text{Equation (2)}$$

where f0 is the resonance frequency, and Cgd is the parasitic capacitance between the gate and the drain of the amplifier transistor M1.

Further, the value of the first inductor Lgd is obtained from the following equation in some embodiments.

$$f0 = \frac{1}{2\pi\sqrt{Lgd \cdot (Cgd + Cds)}}, \quad \text{Equation (3)}$$

-continued $$Lgd = \frac{1}{(2\pi f0)^2(Cgd + Cds)},\qquad \text{Equation (4)}$$

where Cds is the parasitic capacitance between the drain and the source of the amplifier transistor M1.

The low noise amplifier 100 includes the second inductor Lgs coupled between the gate and a high voltage supply node (e.g. Vdd). The second inductor Lgs is arranged to compensate at least part of the parasitic capacitance Cgs between the gate and the source of the amplifier transistor M1 in some embodiments. The first inductor Lgd and the second inductor Lgs are arranged to compensate at least part of parasitic capacitances Cgs between the source and the gate of the amplifier transistor M1, and Cds between the source and the drain of the amplifier transistor M1 in the low noise amplifier 100 in some embodiments. Exemplary design steps are described with respect to FIGS. 1B-1F below.

The low noise amplifier 100 includes a capacitor Cin coupled between the input node and the gate of the amplifier transistor M1 in some embodiments. The capacitor Cin is arranged to provide impedance matching for the input node of the low noise amplifier M1 together with the second inductor Lgs in some embodiments. The impedance matching of the input node is designed for 50 ohm in some embodiments, e.g., for coupling to an antenna. The load impedance at the output node is about 1 Kohm in some embodiments.

In some embodiments, the values of Lgd, Lgs, and Cin are estimated from the method described above, and then a simulation tool can be used to fine tune and determine the values to obtain desired performance from the low noise amplifier 100. In some other embodiments, such a simulation tool can be used exclusively to determine the values of Lgd, Lgs, and Cin to obtain desired performance from the low noise amplifier 100.

In some embodiments, the high voltage power supply node Vdd has a voltage ranging from about 0.1 V to about 3 V for low voltage applications, for example 0.3 V. The operating frequency f0 ranges from about 0.5 GHz to about 20 GHz, for example 2.4 GHz. The first inductor Lgd has a value ranging from about 1 pH to about 100 nH, for example 6.2 nH. The second inductor Lgs has a value ranging from about 1 pH to about 100 nH, for example 5.1 nH. The capacitance Cin has a value ranging from about 1 fF to about 100 pF, for example 0.71 pF. In some embodiments, the power consumption is less than 1 mW for low power applications, for example 0.86 mW.

Figure 1B:
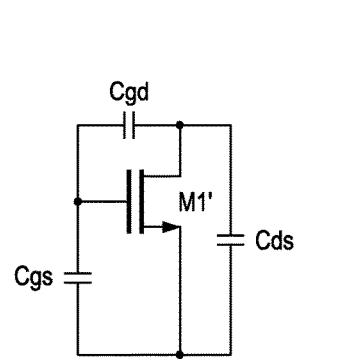
FIGS. 1B-1F illustrate design steps of the low noise amplifier according to some embodiments.

FIGS. 1B-1F illustrates design steps of the low noise amplifier according to some embodiments. In FIG. 1B, the amplifier transistor M1 is divided into a transistor M1' and parasitic capacitances Cgd, Cgs, and Cds. Cgd is the parasitic capacitance between the gate and the drain of the amplifier transistor M1, Cgs is the parasitic capacitance between the source and the gate of the amplifier transistor M1, and Cds is the parasitic capacitance between the source and the drain of the amplifier transistor M1 in the low noise amplifier 100.

Figure 1C:
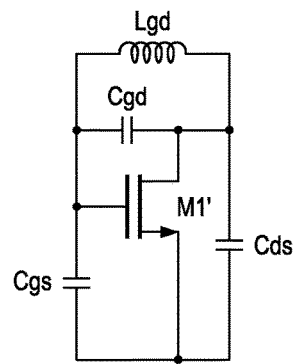

In FIG. 1C, the first inductor Lgd is coupled between the gate and drain of the transistor M1'. Part of the first inductor Lgd is designed to compensate Cgd at the operating frequency f0 by a resonance condition. In some embodiments, the value of the first inductor Lgd is equal to or greater than L, where L is obtained based on Equation (1), or Equation (2).

Figure 1D:
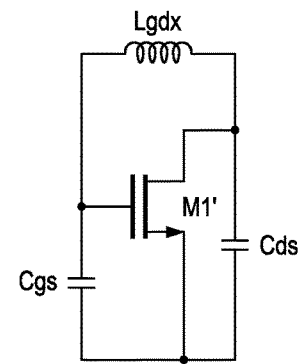

In FIG. 1D, Cgd is removed after part of the first inductor Lgd is used to compensate Cgd. The remaining inductor value of Lgd, i.e., Ldgx=Lgd−L, after part of the first inductor Lgd is used to compensate Cgd, is shown. The parasitic capacitance Cgd between the gate and the drain of the transistor M1' is compensated by part of Lgd based on the resonance condition.

Figure 1E:
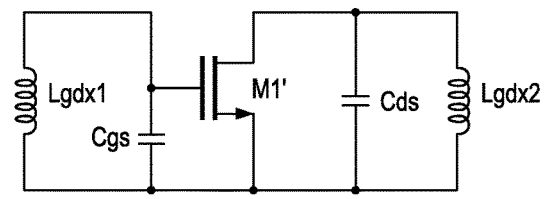

In FIG. 1E, Lgdx is divided into Lgdx1 and Lgdx2 based on Miller effect. The first divided inductor Lgdx1 is considered to be coupled between the gate and the source of the transistor M1', in parallel with Cgs. The second divided inductor Lgdx2 is considered to be coupled between the drain and the source of the transistor M1', in parallel with Cds.

Figure 1F:
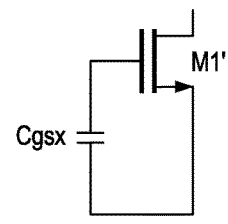

In FIG. 1F, Cds is compensated by Lgdx2, and Lgdx1 can is used to compensate at least part of Cgs and the remaining capacitance of Cgs is shown as Cgsx. The compensation method is similar to the method as described above, based on the resonance condition of an LC circuit. For example, Cds is compensated by Lgdx2 based on the following equation for the resonance condition of the LC circuit.

$$f0 = \frac{1}{2\pi\sqrt{Lgdx \cdot Cds}},\qquad \text{Equation (5)}$$

or $$Lgdx = \frac{1}{(2\pi f0)^2 \cdot Cds},\qquad \text{Equation (6)}$$

where f0 is the operation frequency of the low noise amplifier 100.

In some embodiments, the second inductor Lgs is used to compensate the remaining capacitance Cgsx between the gate and the source of the transistor M1'. The remaining value of the second inductor Lgs is used to provide impedance matching for the input node of the low noise amplifier 100 together with the capacitor C1 in some embodiments. The impedance matching of the input node is designed for 50 ohm, e.g., for an antenna, in some embodiments.

Figure 2:
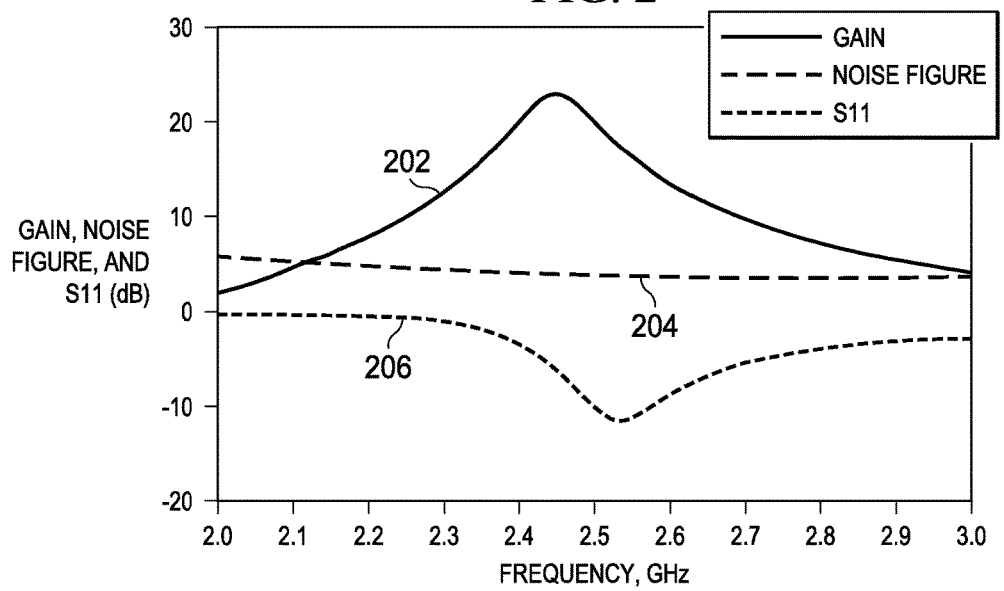
FIG. 2 is a plot showing gain, noise figure (NF), and input matching (reflection) coefficient (S11) performance of the exemplary low noise amplifier in FIG. 1A according to some embodiments.

FIG. 2 is a plot showing gain, noise figure (NF), and input matching (reflection) coefficient (S11) of the exemplary low noise amplifier 100 in FIG. 1A according to some embodiments. A gain plot 202 shows that the gain is about 20 dB at the operating frequency of 2.5 GHz. A noise figure (NF) plot 204 has a value of about 3.9 dB at the operating frequency of 2.5 GHz. An input matching coefficient (S11) plot 206 has a value of about −10 dB at the operating frequency of 2.5 GHz. In this example, the high voltage power supply has a voltage Vdd of 0.3 V and a power consumption of about 0.86 mW.

In comparison, some other low noise amplifiers different from the low noise amplifier 100 have a low gain of 3.1 dB to 13.6 dB with a higher Vdd of 0.6 V to 1 V. In another low noise amplifier different from the low noise amplifier 100 with similar gain and Vdd, the noise figure was 4.7, and the low noise amplifier was not fully integrated, having part of the circuit components off the chip for better quality factor (Q value).

By using the exemplary low noise amplifier 100 in FIG. 1A, a low voltage (0.3V) and low power (0.86 mW) application can be provided with fully integrated implementation of the low noise amplifier 100 with no additional fabrication process steps.

Figure 3:
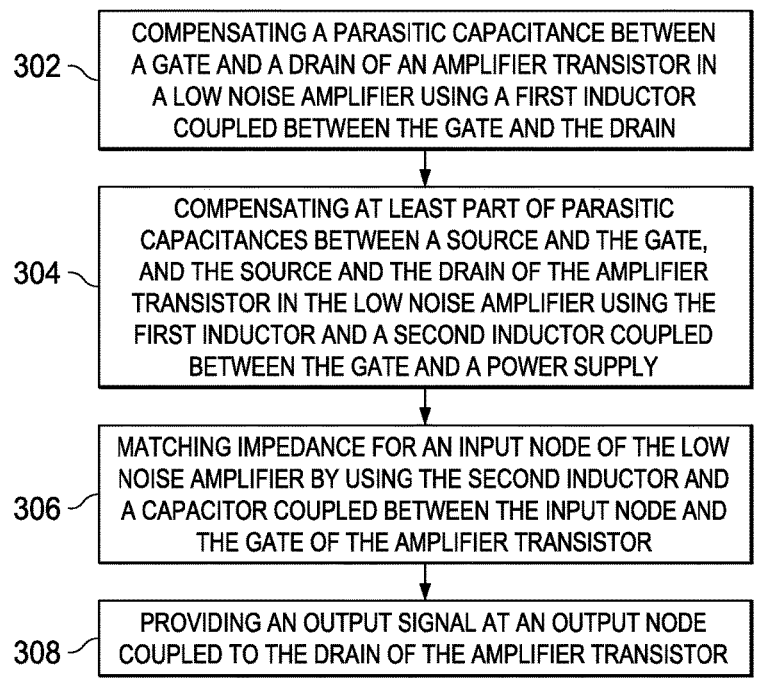
FIG. 3 is a flow diagram illustrating the operation of an exemplary low noise amplifier in FIG. 1A according to some embodiments.

FIG. 3 is a flow diagram illustrating the operation of an exemplary low noise amplifier 100 in FIG. 1A according to some embodiments. At step 302, a parasitic capacitance Cgd between a gate and a drain of an amplifier transistor M1 in a low noise amplifier 100 is compensated using a first inductor Lgd coupled between the gate and the drain of the amplifier transistor M1. The compensation of the parasitic capacitance Cgd is based on a resonance condition of the parasitic capacitance Cgd and part of the first inductor Lgd.

For example, the operating frequency f0 of the low noise amplifier 100 is close to a resonance frequency f0 of the resonance condition for the LC circuit. In some embodiments, the value of the first inductor Lgd is equal to or greater than L, where L is obtained from Equation (1) or Equation (2) as described above, for the resonance condition of the LC circuit. In some embodiments, the value of the first inductor Lgd is obtained from the Equation (3) or Equation (4) as described above in some embodiments.

At step 304, at least part of parasitic capacitances Cgs between a source and the gate, and Cds between the source and the drain of the amplifier transistor M1 in the low noise amplifier 100 are compensated using the first inductor Lgd and a second inductor Lgs coupled between the gate and a power supply. The second inductor Lgs is arranged to compensate at least part of the parasitic capacitance Cgs between the gate and the source of the amplifier transistor M1 in some embodiments. The design steps of the compensation are as described above with respect to FIGS. 1B-1F according to some embodiments.

At step 306, the impedance for an input node of the low noise amplifier is matched by using the second inductor Lgs and a capacitor Cin coupled between the input node and the gate of the amplifier transistor M1. In some embodiments, the input impedance matching is for 50 ohm.

At step 308, an output signal is provided at an output node coupled to the drain of the amplifier transistor M1. The load impedance at the output node of the low noise amplifier 100 is about 1 Kohm in some embodiments.

Figure 4:
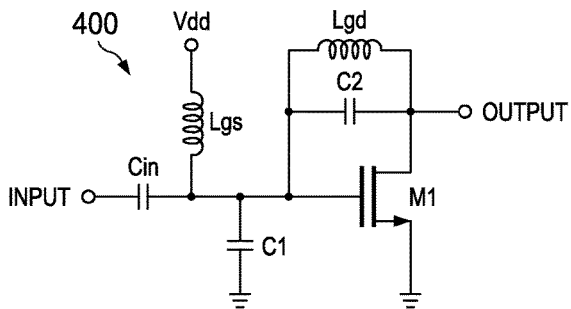
FIGS. 4-7 are schematic diagrams of low noise amplifiers according to some other embodiments.

FIGS. 4-7 are schematic diagrams of low noise amplifiers according to some other embodiments. In FIG. 4, the low noise amplifier 400 includes an amplifier transistor M1 that has a source, a gate, and a drain. In some embodiments, the amplifier transistor M1 is an n-channel metal-oxide-semiconductor field-effect (NMOS) transistor. An input node is coupled to the gate of the amplifier transistor M1. An output node is coupled to the drain the amplifier transistor M1. A first inductor Lgd is coupled between the gate and the drain of the amplifier transistor M1. A second inductor Lgs is coupled between the gate of the amplifier transistor M1 and a high voltage supply node (e.g. Vdd). The source of the amplifier transistor M1 is coupled to a low voltage power supply node (e.g., ground or Vss).

In addition, a capacitor C1 is added between the gate of the amplifier transistor M1 and the low voltage power supply node (ground). Also, another capacitor C2 is added between the gate and the drain of the amplifier transistor M1. The value of Lgd, Lgs, and Cin can be determined by following a similar method as described above.

For example, the capacitor C2 can be considered to be added to the parasitic capacitance Cgd of the amplifier transistor M1 in parallel. Lgd can be used to compensate the combined capacitance of Cgd and C2 as described above. Similarly, the capacitor C1 can be considered to be added to the parasitic capacitance Cgs of the amplifier transistor M1 in parallel. Part of Lgd and Lgs can be used to compensate the combined capacitance of Cgs and C1 as described above.

Figure 5:
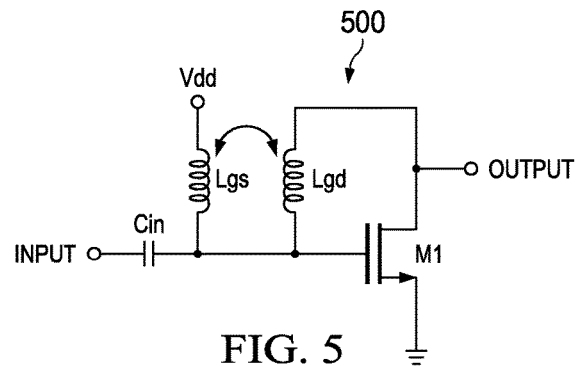

In FIG. 5, the low noise amplifier 500 includes an amplifier transistor M1 that has a source, a gate, and a drain. In some embodiments, the amplifier transistor M1 is an n-channel metal-oxide-semiconductor field-effect (NMOS) transistor. An input node is coupled to the gate of the amplifier transistor M1. An output node is coupled to the drain the amplifier transistor M1. A first inductor Lgd is coupled between the gate and the drain of the amplifier transistor M1. A second inductor Lgs is coupled between the gate of the amplifier transistor M1 and a high voltage supply node (e.g. Vdd). The source of the amplifier transistor M1 is coupled to a low voltage power supply node (e.g., ground or Vss).

In addition, the inductors Lgd and Lgs are coupled as a transformer in some embodiments. The values of Lgd, Lgs, and Cin can be determined by following a similar method as described above.

Figure 6:
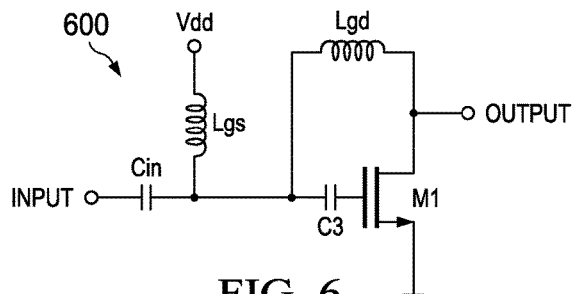

In FIG. 6, the low noise amplifier 600 includes an amplifier transistor M1 that has a source, a gate, and a drain. In some embodiments, the amplifier transistor M1 is an n-channel metal-oxide-semiconductor field-effect (NMOS) transistor. An input node is coupled to the gate of the amplifier transistor M1. An output node is coupled to the drain the amplifier transistor M1. In addition, a capacitor C3 is added at the gate of the amplifier transistor M1 in series. A first inductor Lgd is coupled between the gate (indirectly through capacitor C3) and the drain of the amplifier transistor M1. A second inductor Lgs is coupled between the gate of the amplifier transistor M1 and a high voltage supply node (e.g. Vdd). The source of the amplifier transistor M1 is coupled to a low voltage power supply node (e.g., ground or Vss).

The added capacitor C3 can be considered as adding to the parasitic capacitances of the amplifier transistor M1. The value of Lgd, Lgs, and Cin can be determined by following a similar method as described above.

Figure 7:
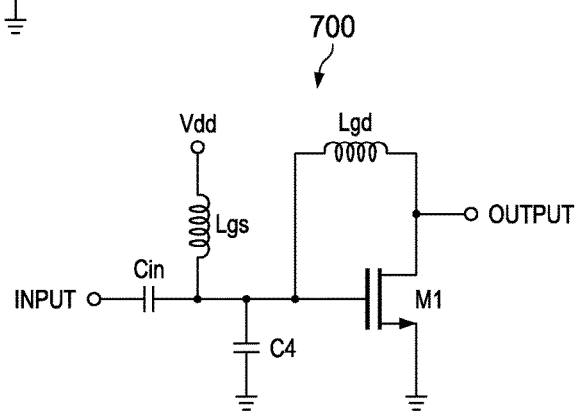

In FIG. 7, the low noise amplifier 700 includes an amplifier transistor M1 that has a source, a gate, and a drain. In some embodiments, the amplifier transistor M1 is an n-channel metal-oxide-semiconductor field-effect (NMOS) transistor. An input node is coupled to the gate of the amplifier transistor M1. An output node is coupled to the drain the amplifier transistor M1. A first inductor Lgd is coupled between the gate and the drain of the amplifier transistor M1. A second inductor Lgs is coupled between the gate of the amplifier transistor M1 and a high voltage supply node (e.g. Vdd). The source of the amplifier transistor M1 is coupled to a low voltage power supply node (e.g., ground or Vss).

In addition, a capacitor C4 is added between the gate of the amplifier transistor M1 and the low voltage power supply node. The capacitor C4 can be considered to be added to the parasitic capacitance Cgs of the amplifier transistor M1 in parallel. The value of Lgd, Lgs, and Cin can be determined by following a similar method as described above.

According to some embodiments, a low noise amplifier includes an amplifier transistor having a source, a gate, and a drain. An input node is coupled to the gate. An output node is coupled to the drain. An inductor is coupled between the gate and the drain.

According to some embodiments, a method includes compensating a parasitic capacitance between a gate and a drain of an amplifier transistor in a low noise amplifier using a first inductor coupled between the gate and the drain. An output signal is provided at an output node coupled to the drain of the amplifier transistor.

According to some embodiments, a low noise amplifier includes an NMOS transistor having a source, a gate, and a drain. An input node is coupled to the gate. An output node is coupled to the drain. A first inductor is coupled between the gate and the drain. The first inductor is arranged to compensate a parasitic capacitance between the gate and the drain of the amplifier transistor. A second inductor is coupled between the gate and a high voltage supply node. The first inductor and the second inductor are arranged to compensate at least part of parasitic capacitances between the source and the gate, and between the source and the drain of the amplifier transistor in the low noise amplifier.

In accordance with an embodiment, an amplifier includes: a n-channel transistor including a gate, a drain connected to an output node, and source connected to a low voltage supply node, the n-channel transistor having a first parasitic capacitance between the gate and the drain, the n-channel transistor having a second parasitic capacitance between the gate and the source; a first inductor connecting the gate of the n-channel transistor to the drain of the n-channel transistor, the first inductor having a first inductance based on a first frequency and the first parasitic capacitance; a second inductor connecting the gate of the n-channel transistor to a high voltage supply node, the second inductor having a second inductance based on the first frequency and the second parasitic capacitance; and a first capacitor connecting the gate of the n-channel transistor to an input node, the first capacitor having a first capacitance based on the first frequency and the second inductance.

In accordance with an embodiment, a system includes: a power supply having a high voltage supply node and a low voltage supply node; an amplifier having an operating frequency, the amplifier including: a n-channel transistor including a gate, a drain connected to an output node, and source connected to the low voltage supply node, the n-channel transistor having a first parasitic capacitance between the gate and the drain, the n-channel transistor having a second parasitic capacitance between the gate and the source; a first inductor connecting the gate of the n-channel transistor to the drain of the n-channel transistor, the first inductor having a first inductance based on the operating frequency and the first parasitic capacitance; a second inductor connecting the gate of the n-channel transistor to the high voltage supply node, the second inductor having a second inductance based on the operating frequency and the second parasitic capacitance; and a first capacitor connecting the gate of the n-channel transistor to an input node, the first capacitor having a first capacitance based on the operating frequency and the second inductance; an antenna connected to the input node; and a load connected to the output node.

In accordance with an embodiment, a method includes: determining a first parasitic capacitance between a gate and a drain of a n-channel transistor; determining a second parasitic capacitance between the gate and a source of the n-channel transistor; determining a third parasitic capacitance between the drain and the source of the n-channel transistor; connecting a first inductor between the gate and the drain of the n-channel transistor to compensate for the first parasitic capacitance; connecting a second inductor between the gate of the n-channel transistor and a high voltage supply node to compensate for the second parasitic capacitance and the third parasitic capacitance; and connecting the drain of the n-channel transistor to an output node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An amplifier comprising:
a n-channel transistor comprising a gate, a drain connected to an output node, and source connected to a low voltage supply node, the n-channel transistor having a first parasitic capacitance between the gate and the drain, the n-channel transistor having a second parasitic capacitance between the gate and the source;
a first inductor connecting the gate of the n-channel transistor to the drain of the re-channel transistor, the first inductor having a first inductance based on a first frequency and the first parasitic capacitance;
a second inductor connecting the gate of the n-channel transistor to a high voltage supply node, the second inductor having a second inductance based on the first frequency and the second parasitic capacitance; and
a first capacitor connecting the gate of the n-channel transistor to an input node, the first capacitor having a first capacitance based on the first frequency and the second inductance,
wherein the gate of the n-channel transistor is connected to a first node between the first inductor and the second inductor, the first inductor being in a first electrically conductive path from the first node, through the body of the first inductor, and to the drain of the n-channel transistor, the second inductor being in a second electrically conductive path from the first node, through the body of the second inductor, and to the high voltage supply node.

2. The amplifier of claim 1, further comprising:
a second capacitor connecting the gate of the n-channel transistor to the low voltage supply node, the second capacitor having a second capacitance based on the second parasitic capacitance.

3. The amplifier of claim 2, further comprising:
a third capacitor connecting the gate of the n-channel transistor to the drain of the n-channel transistor, the third capacitor having a third capacitance based on the first parasitic capacitance.

4. The amplifier of claim 1, wherein the first inductor and the second inductor form a transformer.

5. The amplifier of claim 1, wherein the first capacitance and the second inductance provide impedance matching of 50 ohms at the input node.

6. The amplifier of claim 1, wherein a load impedance at the output node is 1000 ohms.

7. The amplifier of claim 1, wherein the n-channel transistor has a third parasitic capacitance between the source and the drain, and the first inductance of the first inductor is further based on the third parasitic capacitance.

8. The amplifier of claim 7, wherein the first frequency obtained from $$f0 = \frac{1}{2\pi\sqrt{Lgd \cdot (Cgd + Cds)}},$$

wherein f0 is the first frequency, Lgd is the first inductance, Cgd is the first parasitic capacitance, and Cds is the third parasitic capacitance.

9. The amplifier of claim 1, wherein a potential difference between the high voltage supply node and the low voltage supply node is 0.3 V.

10. A system comprising:
a power supply having a high voltage supply node and a low voltage supply node;
an amplifier having an operating frequency, the amplifier comprising:
a n-channel transistor comprising a gate, a drain connected to an output node, and source connected to the low voltage supply node, the n-channel transistor having a first parasitic capacitance between the gate and the drain, the n-channel transistor having a second parasitic capacitance between the gate and the source;
a first inductor, the first inductor connecting the gate of the n-channel transistor to the drain of the n-channel transistor, the first inductor having a first inductance based on the operating frequency and the first parasitic capacitance;
a second inductor, the second inductor connecting the gate of the n-channel transistor to the high voltage supply node, the second inductor and the first inductor being connected in series between the high voltage supply node and the drain of the n-channel transistor, the second inductor having a second inductance based on the operating frequency and the second parasitic capacitance; and
a first capacitor connecting the gate of the n-channel transistor to an input node, the first capacitor having a first capacitance based on the operating frequency and the second inductance;
an antenna connected to the input node; and
a load connected to the output node.

11. The system of claim 10, wherein an impedance of the load is 1000 ohms.

12. The system of claim 10, wherein the first capacitance and the second inductance provide impedance matching of 50 ohms for the antenna.

13. The system of claim 10, wherein the power supply provides a potential difference between the high voltage supply node and the low voltage supply node of 0.3 V.

14. The system of claim 10, further comprising:
a second capacitor connecting the gate of the n-channel transistor to the low voltage supply node, the second capacitor having a second capacitance based on the second parasitic capacitance.

15. The system of claim 14, further comprising:
a third capacitor connecting the gate of the n-channel transistor to the drain of the re-channel transistor, the third capacitor having a third capacitance based on the first parasitic capacitance.

16. The system of claim 10, wherein the first inductor and the second inductor form a transformer.

17. A method comprising:
determining a first parasitic capacitance between a gate and a drain of a n-channel transistor;
determining a second parasitic capacitance between the gate and a source of the re-channel transistor;
determining a third parasitic capacitance between the drain and the source of the re-channel transistor;
connecting a first inductor in a first current path between the gate and the drain of the re-channel transistor to compensate for the first parasitic capacitance;
connecting a second inductor in a second current path between the gate of the n-channel transistor and a high voltage supply node to compensate for the second parasitic capacitance and the third parasitic capacitance; and
connecting the drain of the n-channel transistor to an output node.

18. The method of claim 17, wherein the first inductor has a first inductance determined according to $$Lgd = \frac{1}{(2\pi f0)^2 \cdot (Cgd + Cds)},$$

wherein Lgd is the first inductance, f0 is an operating frequency of the n-channel transistor, Cgd is the first parasitic capacitance, and Cds is the third parasitic capacitance.

19. The method of claim 18, wherein the operating frequency of the n-channel transistor is 2.4 GHz.

20. The method of claim 17, further comprising:
connecting a first capacitor between the gate of the n-channel transistor and an input node;
connecting a second capacitor between the gate of the n-channel transistor and a low voltage supply node; and
connecting a third capacitor between the gate of the n-channel transistor and the drain of the n-channel transistor.

* * * * *